(12) United States Patent
Kobayashi et al.

(10) Patent No.: US 10,775,552 B2
(45) Date of Patent: Sep. 15, 2020

(54) DISPLAY DEVICE

(71) Applicant: SONY CORPORATION, Tokyo (JP)

(72) Inventors: Naoto Kobayashi, Chiba (JP); Makoto Nakagawa, Kanagawa (JP); Tomoya Yano, Kanagawa (JP)

(73) Assignee: Sony Corporation (JP)

(*) Notice: Subject to any disclaimer, the term of this patent is extended or adjusted under 35 U.S.C. 154(b) by 4 days.

(21) Appl. No.: 16/069,330

(22) PCT Filed: Nov. 11, 2016

(86) PCT No.: PCT/JP2016/083500
§ 371 (c)(1),
(2) Date: Jul. 11, 2018

(87) PCT Pub. No.: WO2017/138202
PCT Pub. Date: Aug. 17, 2017

(65) Prior Publication Data
US 2019/0011631 A1    Jan. 10, 2019

(30) Foreign Application Priority Data

Feb. 9, 2016 (JP) ................................. 2016-022623

(51) Int. Cl.
*H05K 7/20* (2006.01)
*F21V 8/00* (2006.01)
(Continued)

(52) U.S. Cl.
CPC .............. *G02B 6/0085* (2013.01); *F21S 2/00* (2013.01); *F21V 29/15* (2015.01); *F21V 29/503* (2015.01);
(Continued)

(58) Field of Classification Search
None
See application file for complete search history.

(56) References Cited

U.S. PATENT DOCUMENTS 5,819,407 A    10/1998  Terada
5,831,374 A    11/1998  Morita et al.
(Continued)

FOREIGN PATENT DOCUMENTS

CN    1161621 A    10/1997
CN    1122154 C     9/2003
(Continued)

OTHER PUBLICATIONS

International Search Report and Written Opinion of PCT Application No. PCT/JP2016/083500, dated Jan. 24, 2017, 12 pages of ISRWO.

*Primary Examiner* — Courtney L Smith
(74) *Attorney, Agent, or Firm* — Lerner, David, Littenberg, Krumholz & Mentlik, LLP

(57) ABSTRACT

A heat sink 41 is provided on a lower edge side, for example, of a display panel 21 with a heat radiation surface being on a display surface side of the display panel 21. A heat source, such as a light source 22, which generates heat owing to display operation using the display panel 21 is mounted on a mounting face opposite to the heat radiation surface. A cover 31 that covers the heat sink 41 is provided on the display surface side of the display panel 21. Air holes 311 and 312 are formed on a top face 31t and a bottom face 31b, respectively, of the cover 31. Air taken in through the air holes 312 on the bottom face 31b of the cover 31 cools the heat sink 41, and the air heated by the heat of the heat sink 41 is dissipated outside through the air holes 311 on the top face 31t. Heat generated inside the display device is efficiently dissipated with a small ventilation resistance without generation of noise. Since heat is dissipated on the display surface side, discoloration of wall paper on a mounting face and the like is prevented or reduced.

13 Claims, 13 Drawing Sheets

(51) Int. Cl.
*F21V 29/15* (2015.01)
*F21V 29/503* (2015.01)
*F21V 29/76* (2015.01)
*F21V 29/83* (2015.01)
*G09F 9/00* (2006.01)
*F21V 29/508* (2015.01)
*F21S 2/00* (2016.01)
*F21V 29/73* (2015.01)
*G02F 1/1333* (2006.01)
*G02F 1/13357* (2006.01)

(52) U.S. Cl.
CPC ............ *F21V 29/508* (2015.01); *F21V 29/73* (2015.01); *F21V 29/76* (2015.01); *F21V 29/83* (2015.01); *G02F 1/133308* (2013.01); *G02F 1/133385* (2013.01); *G09F 9/00* (2013.01); *H05K 7/20* (2013.01); *H05K 7/20963* (2013.01); *G02F 2001/13332* (2013.01); *G02F 2001/133628* (2013.01); *G02F 2201/36* (2013.01)

(56) References Cited

U.S. PATENT DOCUMENTS

| | | | |
|---|---|---|---|
| 6,175,493 B1* | 1/2001 | Gold | G06F 1/203 174/15.2 |
| 6,315,032 B1 | 11/2001 | Lee et al. | |
| 6,816,371 B2* | 11/2004 | Agata | G06F 1/203 165/121 |
| 8,040,677 B2 | 10/2011 | Lee | H05K 7/20963 361/704 |
| 8,320,119 B2* | 11/2012 | Isoshima | H05K 7/20972 165/104.34 |
| 2004/0042171 A1* | 3/2004 | Takamatsu | G06F 1/203 361/679.48 |
| 2005/0051297 A1 | 3/2005 | Kuo | |
| 2005/0117304 A1* | 6/2005 | Kim | H05K 7/20 361/704 |
| 2006/0005549 A1* | 1/2006 | Ishinabe | F25B 21/02 62/3.2 |
| 2006/0076121 A1 | 4/2006 | Zhong et al. | |
| 2006/0098398 A1* | 5/2006 | Kim | G06F 1/1601 361/679.22 |
| 2006/0157224 A1 | 7/2006 | Tang | |
| 2006/0187641 A1* | 8/2006 | Shin | H05K 7/20963 361/704 |
| 2006/0275965 A1 | 12/2006 | Jeong | |
| 2007/0267174 A1* | 11/2007 | Kim | H05K 7/20963 165/80.3 |
| 2008/0285290 A1 | 11/2008 | Ohashi et al. | |
| 2010/0165239 A1 | 7/2010 | Lee et al. | |
| 2011/0141697 A1 | 6/2011 | Fujii et al. | |
| 2013/0027936 A1 | 1/2013 | Ladewig et al. | |
| 2013/0264042 A1 | 10/2013 | Qin et al. | |
| 2014/0009888 A1* | 1/2014 | MacDonald | G06F 1/1681 361/701 |
| 2014/0125877 A1 | 5/2014 | Nakamura et al. | |
| 2014/0152906 A1 | 6/2014 | Yokawa et al. | |
| 2018/0199450 A1* | 7/2018 | Kim | G02F 1/133308 |

FOREIGN PATENT DOCUMENTS

| | | |
|---|---|---|
| CN | 2727958 Y | 9/2005 |
| CN | 2733589 Y | 10/2005 |
| CN | 1870080 A | 11/2006 |
| CN | 101308269 B | 8/2010 |
| CN | 102124396 A | 7/2011 |
| CN | 103369919 A | 10/2013 |
| CN | 103597532 A | 2/2014 |
| CN | 203597012 U | 5/2014 |
| CN | 103852925 A | 6/2014 |
| CN | 203788622 U | 8/2014 |
| CN | 204965956 U | 1/2016 |
| DE | 69616870 T2 | 5/2002 |
| EP | 0744241 A2 | 11/1996 |
| JP | 09-019728 A | 1/1997 |
| JP | 09/019728 A | 1/1997 |
| JP | 09-199040 A | 7/1997 |
| JP | 2004-045680 A | 2/2004 |
| JP | 2005-196001 A | 7/2005 |
| JP | 2006-330679 A | 12/2006 |
| JP | 2008-165101 A | 7/2008 |
| JP | 2008304630 A | 12/2008 |
| JP | 2010-039257 A | 2/2010 |
| JP | 2010-054718 A | 3/2010 |
| JP | 2013-148854 A | 8/2013 |
| JP | 2013150306 A | 8/2013 |
| JP | 2014-106497 A | 6/2014 |
| KR | 10-0254161 B1 | 6/2000 |
| KR | 10-2006-0121461 A | 11/2006 |
| KR | 10-2011-0058776 A | 6/2011 |
| MY | 120686 A | 11/2005 |
| RU | 2011105159 A | 8/2012 |
| TW | 311984 B | 8/1997 |
| WO | 2010/024299 A1 | 3/2010 |
| WO | 2012/169266 A1 | 12/2012 |

* cited by examiner

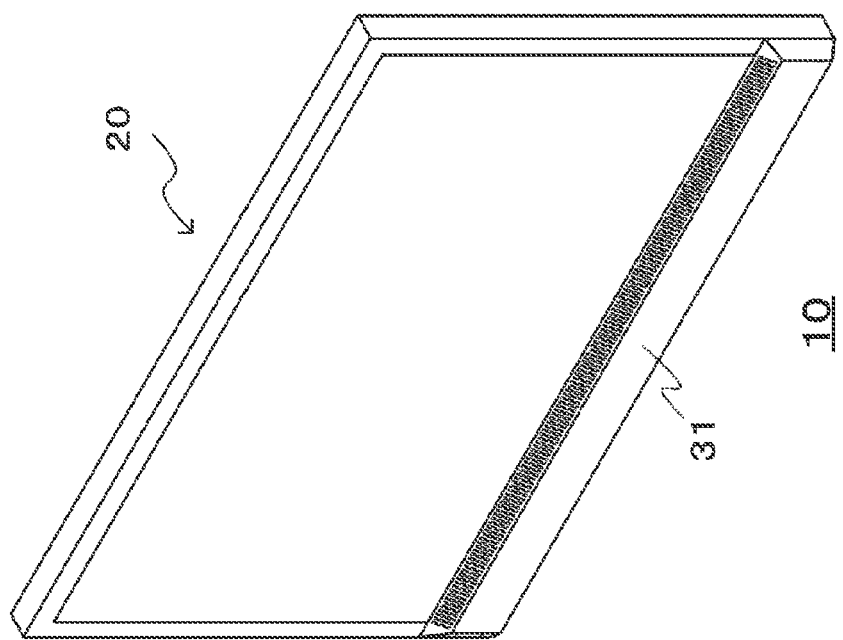

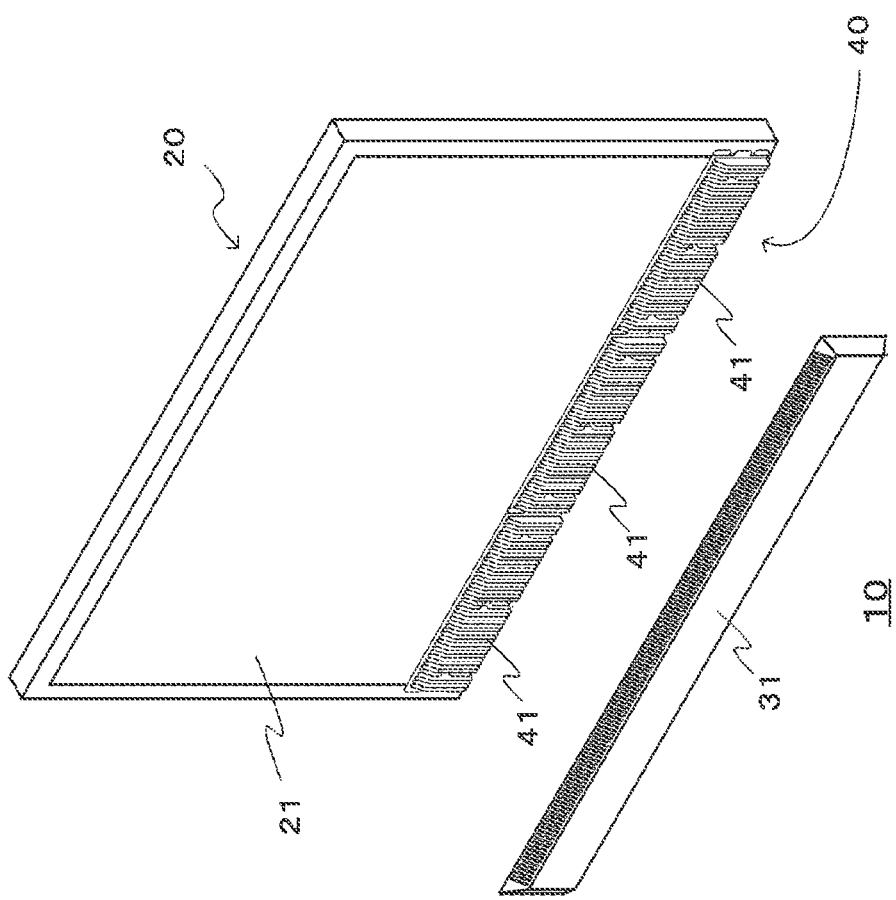

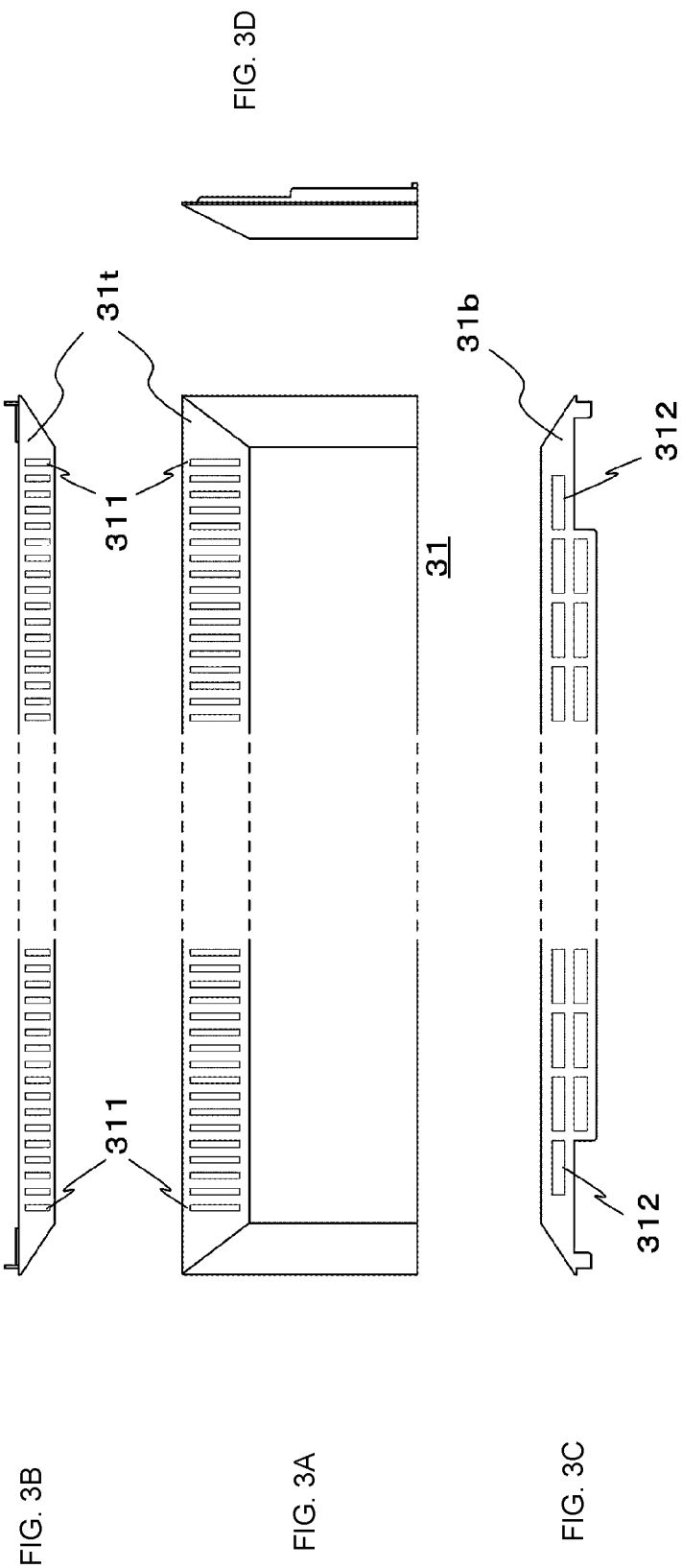

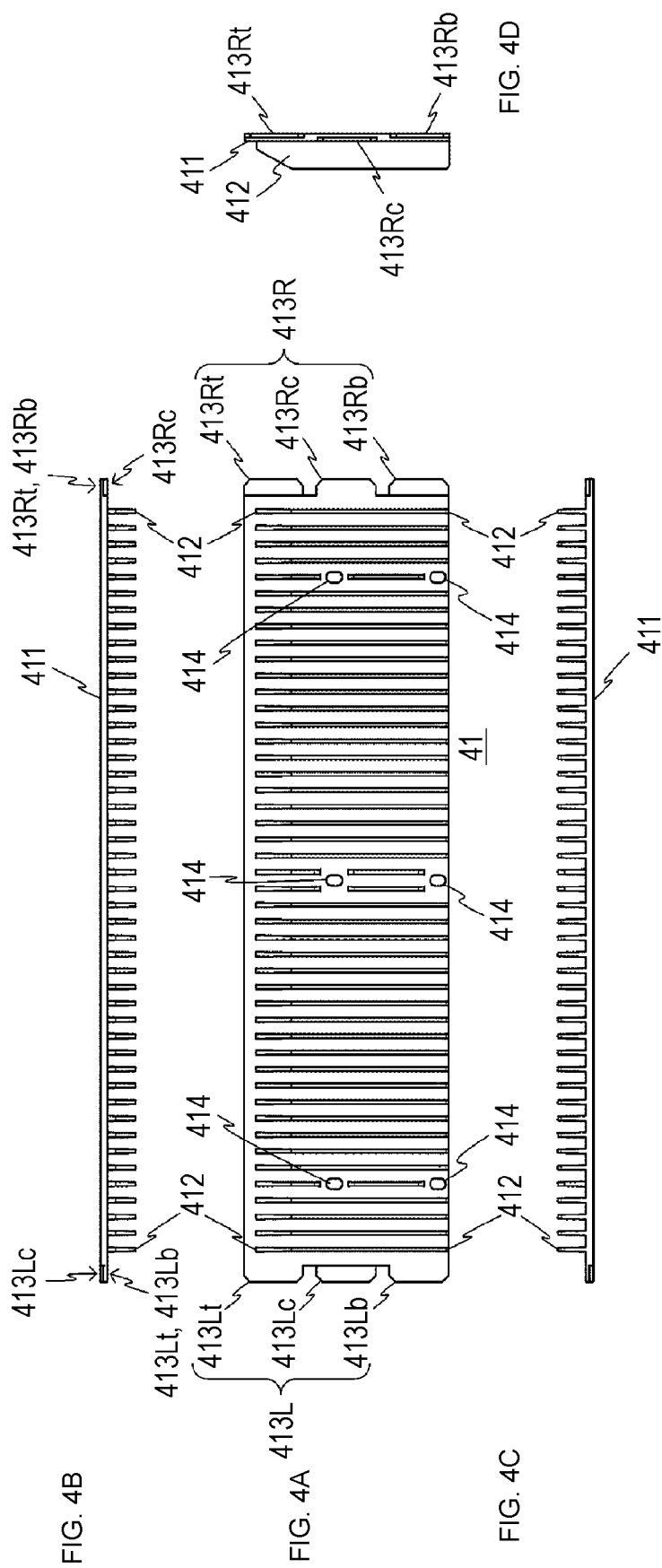

DISPLAY DEVICE

CROSS REFERENCE TO RELATED APPLICATIONS

This application is a U.S. National Phase of International Patent Application No. PCT/JP2016/083500 filed on Nov. 11, 2016, which claims priority benefit of Japanese Patent Application No. JP 2016-022623 filed in the Japan Patent Office on Feb. 9, 2016. Each of the above-referenced applications is hereby incorporated herein by reference in its entirety.

TECHNICAL FIELD

The present technology relates to a heat radiation mechanism of a display device.

BACKGROUND ART

In related art, in a display device such as a liquid crystal display or an organic EL display, heat generated by driving of a display panel and the like is radiated outside of the display device. For example, in a display device of Patent Document 1, fans and radiators are provided between front holes formed on a display surface side of a display panel and back holes formed on a side opposite to the display surface in such a manner that the fans and the radiators overlap with the front holes and the back holes as viewed from the display surface side. In the display device having such a configuration, air is caused to flow from the front holes to the back holes or from the back holes to the front holes by the fans, which allows efficient heat radiation by the radiators. In addition, in a thin display device of Patent Document 2, speaker grilles covered with punched metals having a number of small-diameter holes are provided on respective sides of a screen, and light-blocking grilles are provided on inner sides of the speaker grilles. In the thin display device having such a configuration, heat generated by a board located inside a cabinet is dissipated through the small-diameter holes formed in the light-blocking grilles and the punched metals.

CITATION LIST

Patent Document

Patent Document 1: Japanese Patent Application Laid-Open No. 2010-039257
Patent Document 2: Japanese Patent Application Laid-Open No. 2005-196001

SUMMARY OF THE INVENTION

Problems to be Solved by the Invention

Note that, in a case where radiators are cooled by forced air cooling using fans, noise may be generated by the fans, clogging of front holes and back holes due to dust and dirt sucked during the forced air cooling, and the like may occur. In addition, in a case where heat is dissipated through holes formed on a panel provided on a front face of a display device, heated air inside the device rises, then changes its direction by 90 degrees, and is dissipated to the outside. Thus, ventilation resistance increases due to the change in the air flow direction, which prevents efficient heat dissipation.

An object of the present technology is therefore to provide a display device capable of efficiently dissipating heat generated inside the display device.

Solutions to Problems

A first aspect of the present technology is a display device including:

a heat sink part provided on a lower edge side or an upper edge side of a display panel, a heat radiation surface of the heat sink part being on a display surface side of the display panel, a heat source that generates heat owing to operation using the display panel being mounted on a surface of the heat sink part different from the heat radiation surface; and a cover provided on the display surface side of the display panel to cover the heat sink part, the cover having a top face and a bottom face each having air holes.

According to the present technology, a heat sink part is provided on a lower edge side or an upper edge side of a display panel. The heat sink part includes a plurality of heat sinks connected in a direction along a lower edge or an upper edge of the display panel, a coupling portion formed on each of the heat sinks being coupled to a coupling portion formed on another of the heat sinks, for example. A heat radiation surface of the heat sink is on the display surface side of the display panel, and a heat source that generates heat owing to display operation using the display panel is mounted on a surface of the heat sink different from the heat radiation surface.

The coupling portions prevent curving in a direction perpendicular to the heat radiation surface at the coupling portions of the plurality of heat sinks. For example, the coupling portions each have a first engagement piece protruding on a heat radiation surface side of a coupling face of each heat sink and a second engagement piece protruding on a side opposite to the heat radiation surface side, the first engagement piece and the second engagement piece are arranged at predetermined intervals, positions of inner faces of the first engagement piece and the second engagement piece being in alignment with one another. A first heat sink and a second heat sink are connected such that inner faces of a first engagement piece of the first heat sink and a second engagement piece of the second heat sink face each other and that inner faces of a second engagement piece of the first heat sink and a first engagement piece of the second heat sink face each other, so that curving in a direction perpendicular to the display surface at the coupling portions is prevented. In addition, the coupling portions connect the plurality of heat sinks such that the heat sinks can be elongated and contracted in the direction along the lower edge or the upper edge of the display panel.

Radiating fins are formed on the heat radiation surface of the heat sink, and the radiating fins of the heat sink are located between the air holes on the bottom face and the air holes on the top face of the cover.

The heat source mounted on the heat sink is a light source that outputs light to illuminate a non-emissive display panel, for example, and is fixed to the heat sink with a buffer member, such as thermally-conductive grease, between the heat source and the heat sink, the buffer member having a predetermined thermal conductivity and absorbing a difference in thermal expansion between the heat source and the heat sink. The light source includes light emitting elements that emit light to illuminate the display panel, a board on which the light emitting elements are mounted, a light guide part to guide light emitted from the light emitting elements to a light guide plate provided on a back surface of the display panel, and a resin mold that integrally fixes the light guide part onto the board. The light source is provided between an inner face side of a back chassis and the heat sink, the back chassis being provided on a side opposite to the display surface side of the display panel, the board facing the heat sink, the resin mold facing the back chassis.

For example, a back chassis having a structure including metal sheets and a heat insulating layer between the metal sheets is provided on a side opposite to the display surface side of the display panel, and the heat sink is fixed to the back chassis.

In addition, the heat source and the heat sink part are provided on each of a lower edge side and an upper edge side of the display panel, and the heat source is mounted on the heat sink part at each of the lower edge side and the upper edge side. In addition, in a case where the display panel is an emissive display panel, the heat source including a drive circuit that drives the display panel is mounted on the heat sink.

Effects of the Invention

According to the present technology, a heat sink part is provided on a lower edge side or an upper edge side of a display panel, a heat radiation surface of the heat sink part being on a display surface side of the display panel, a heat source that generates heat owing to operation using the display panel being mounted on a surface of the heat sink part different from the heat radiation surface. In addition, a cover is provided on the display surface side of the display panel to cover the heat sink part, the cover having a top face and a bottom face each having air holes. Thus, since air taken in through the air holes formed on the bottom face of the cover cools the heat sinks and air heated by the heat of the heat sinks is dissipated through the air holes formed on the top face of the cover, heat generated inside the display device is efficiently dissipated from the display surface side with a small ventilation resistance. Note that the effects mentioned herein are exemplary only and are not limiting, and additional effects may also be produced.

BRIEF DESCRIPTION OF DRAWINGS

FIG. 1 illustrates an example of an external view of a display device.

FIG. 2 illustrates an example of a state in which a cover is removed.

FIGS. 3A, 3B, 3C, and 3D illustrate an example of a structure of the cover.

FIGS. 4A, 4B, 4C, and 4D illustrate an example of a structure of a heat sink.

MODE FOR CARRYING OUT THE INVENTION

Figure 5A:
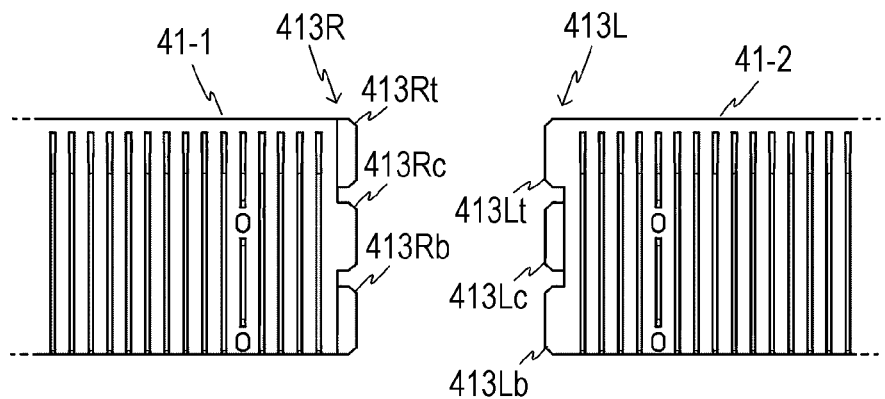
FIGS. 5A, 5B, and 5C illustrate drawings for explaining connection of heat sinks.

Embodiments for carrying out the present technology will be described below. Note that the description will be made in the following order.
1. First Embodiment
2. Second Embodiment
3. Third Embodiment
4. Other Embodiments 1. First Embodiment FIG. 1 illustrates an example of an external view of a display device. The display device 10 is provided with a cover 31, which covers a heat sink part, on a front face at a lower portion of a display panel part 20. FIG. 2 illustrates an example of a state in which the cover is removed from the display device. The display device 10 is provided with the heat sink part 40 on a lower edge side of a display panel 21 used for the display panel part 20, and a heat radiation surface of the heat sink part 40 is on a display surface side of the display panel part. The heat sink part 40 is constituted by one heat sink 41 or a plurality of heat sinks 41 connected in a direction along the lower edge of the display panel 21. Note that FIG. 2 illustrates an example of a case where a plurality of heat sinks 41 are connected in the direction along the lower edge of the display panel 21. [0017]

FIGS. 3A, 3B, 3C, and 3D illustrate an example of a structure of the cover. Note that FIG. 3A is a front view, FIG. 3B is a plan view, FIG. 3C is a bottom view, and FIG. 3D is a side view.

Air holes 311 are formed on a top face 31*t* of the cover 31. The air holes 311 are rectangular slits, for example, the longitudinal direction of which is the front-back direction of the display device. Note that a plurality of air holes 311 are formed at predetermined intervals along the longitudinal direction of the top face 31*t*. In addition, the air holes 311 have a size set so that foreign substances and the like are less likely to enter from above. Note that the cover 31 has a smaller height on a front side than on a back side (on the side of the display panel), and the top face 31*t* is thus an inclined face.

Air holes 312 are formed on a bottom face 31*b* of the cover 31. The air holes 312 have larger openings than those of the air holes 311 formed on the top face 31*t* since foreign substances and the like are less likely to enter through the air holes 312, which are formed on the bottom face 31*b*, and so that the ventilation amount becomes larger.

FIGS. 4A, 4B, 4C, and 4D illustrate an example of a structure of a heat sink. The heat sink 41 has radiating fins 412 on the heat radiation surface, which is a front face of a body part 411. In addition, in a case where a plurality of heat sinks are connected, the heat sink 41 has coupling portions 413L and 413R on coupling faces thereof, which are side faces thereof. The heat sink 41 has mounting holes 414 for fixing the heat sink 41. Note that the heat sink 41 has a mounting face, which is a face different from the heat radiation surface such as a face opposite to the heat radiation surface, for example, and a heat source is mounted on the mounting face as will be described later.

A plurality of radiating fins 412 are formed at predetermined intervals along the longitudinal direction of the body part 411, the longitudinal direction of each of the radiating fins 412 being a direction perpendicular to the longitudinal direction of the body part 411. In addition, an upper end side of each of the radiating fins 412 has a cutout having a shape corresponding to the inclination of the top face 31*t* of the cover 31.

The coupling portions 413L and 413R are formed such that the coupling portion 413R of one heat sink can be coupled to the coupling portion 413L of another heat sink. In addition, the coupling portions 413L and 413R connect the plurality of fixed heat sinks in such a manner that the heat sinks can be elongated and contracted in the direction along the lower edge of the display panel 21 so that the connection of the heat sinks is maintained even when the heat sinks are elongated or contracted by heat. In addition, the coupling portions 413L and 413R are formed to be capable of preventing the display device from curving in the front-back direction (a direction perpendicular to the heat radiation surface) at the coupling portions. For example, the coupling portion 413L has engagement pieces 413Lt and 413Lb protruding from the body part 411 on the heat radiation surface side of a left side face (coupling face) of the body part 411 and an engagement piece 413Lc protruding from the body part 411 on the mounting face side, the engagement pieces 413Lt, 413Lc, and 413Lb being arranged at predetermined intervals. Similarly, the coupling portion 413R has an engagement piece 413Rc protruding from the body part 411 on the heat radiation surface side of a right side face (coupling face) of the body part 411 and engagement pieces 413Rt and 413Rb protruding from the body part 411 on the mounting face side, the engagement pieces 413Rt, 413Rc, and 413Rb being arranged at predetermined intervals. Furthermore, the positions of inner faces of the engagement pieces 413Lt and 413Lb and the engagement piece 413Lc and the positions of inner faces of the engagement piece 413Rc and the engagement pieces 413Rt and 413Rb are in alignment with one another.

While a case where the coupling portion 413R is provided on the right side face of the heat sink 41 and the coupling portion 413L is provided on the left side face thereof is illustrated in FIGS. 4A, 4B, 4C, and 4D, a heat sink at the left end of the heat sink part 40 may be provided with a coupling portion 413R only. Similarly, a heat sink at the right end may be provided with a coupling portion 413L only.

Figure 5B:
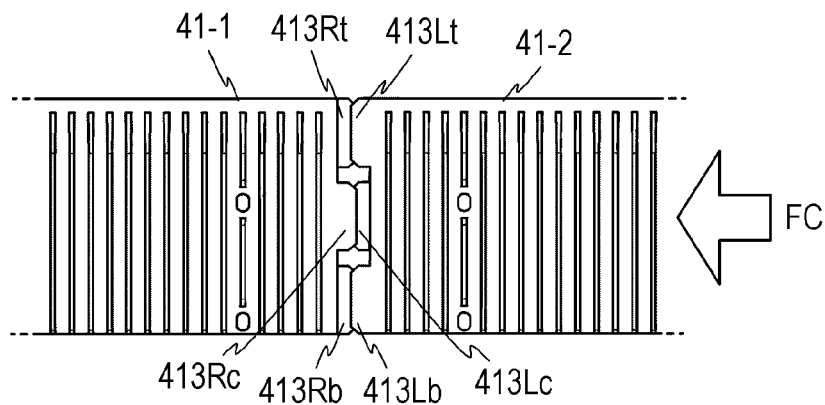
Figure 5C:
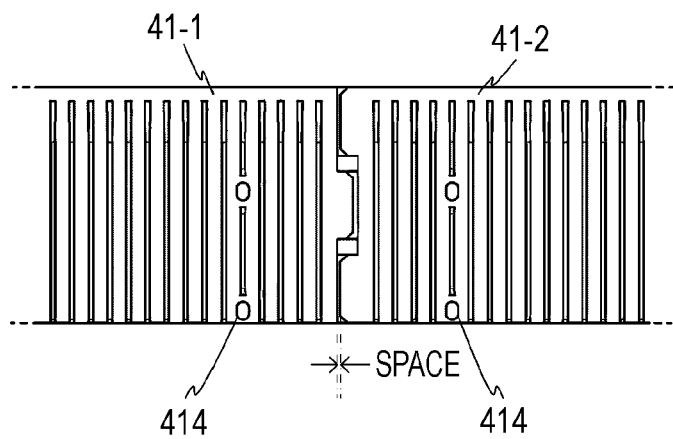

FIGS. 5A, 5B, and 5C illustrate drawings for explaining connection of heat sinks. For connecting heat sinks 41-1 and 41-2 to each other, one of the heat sinks is moved toward the other with the coupling portion 413L of the heat sink 41-1 being positioned to face the coupling portion 413R of the heat sink 41-2 as illustrated in FIG. 5A. For example, FIG. 5B illustrates a case where the heat sink 41-2 is moved in the direction of an arrow FC, that is, toward the heat sink 41-1 with the inner faces of the respective engagement pieces of the coupling portion 413L and the inner faces of the respective engagement pieces of the coupling portion 413R facing one another, so that the heat sink 41-2 is connected with the heat sink 41-1. When the coupling portion 413L and the coupling portion 413R are coupled to each other, the inner face of the engagement piece 413Rt is in close contact with the inner face of the engagement piece 413Lt. Similarly, the inner face of the engagement piece 413Rc and the inner face of the engagement piece 413Lc are in close contact with each other, and the inner face of the engagement piece 413Rb and the inner face of the engagement piece 413Lb are in close contact with each other.

Figure 6:
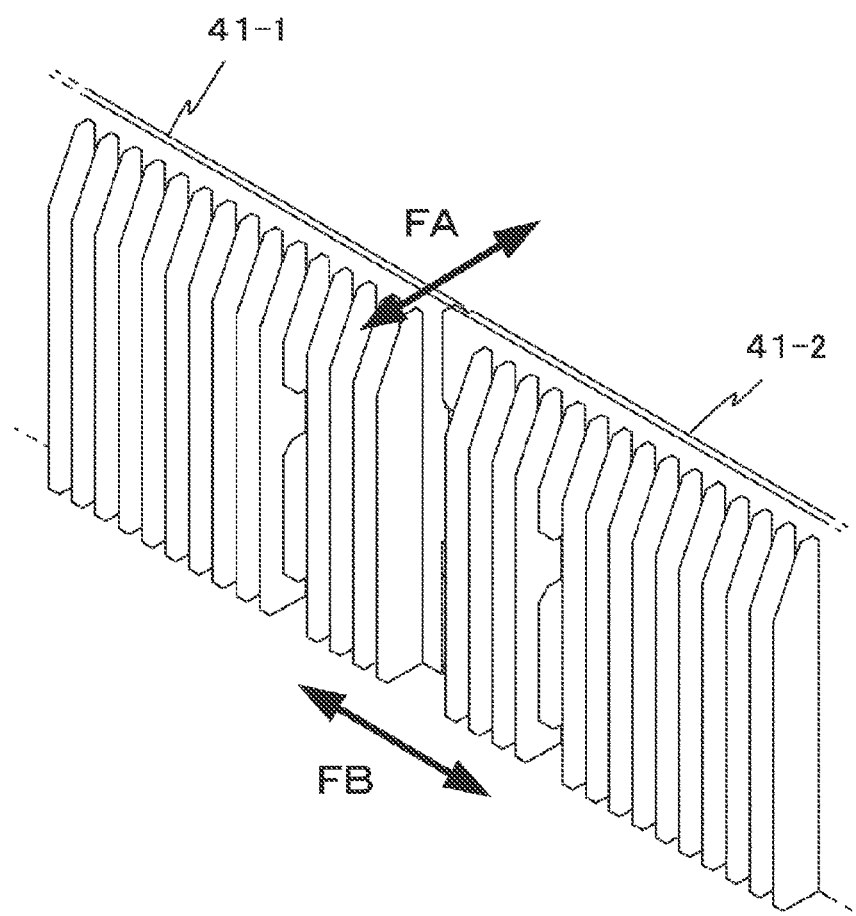
FIG. 6 is a drawing for explaining a connected state of heat sinks.

When the coupling portion 413L and the coupling portion 413R are coupled to each other in this manner, a force applied to the coupling portions in a direction in which the inner face of the engagement piece 413Rt (413Rb) and the inner face of the engagement piece 413Lt (413Lb) are separated from each other, for example, acts as a force bringing the inner face of the engagement piece 413Rc and the inner face of the engagement piece 413Lc into closer contact with each other. Similarly, a force applied in a direction in which the inner face of the engagement piece 413Rc and the inner face of the engagement piece 413Lc are separated from each other acts as a force bringing the inner face of the engagement piece 413Rt (413Rb) and the inner face of the engagement piece 413Lt (413Lb) into closer contact with each other. Specifically, in FIG. 6 illustrating a connected state of the heat sinks, curving in the direction of an arrow FA, that is, the front-back direction of the display device (a direction perpendicular to the heat radiation surface) is prevented.

In addition, as illustrated in of FIG. 5C, when the heat sinks 41-1 and 41-2 in the connected state are mounted on a back chassis or the like with use of the mounting holes 414, the plurality of heat sinks can be elongated and contracted in the direction of connection. Specifically, spaces are provided between ends of the engagement pieces 413Rt, 413Rc, and 413Rb of the heat sink 41-1 and the left side face of the heat sink 41-2 and between ends of the engagement pieces 413Lt, 413Lc, and 413Lb of the heat sink 41-2 and the right side face of the heat sink 41-1. In a case where the heat sinks 41-1 and 41-2 are mounted in this manner, since the elongation and contraction in the direction of an arrow FB, that is the direction of connection, is enabled in FIG. 6 illustrating the connected state of the heat sinks, the connection is maintained even if the size in the connection direction of the heat sinks 41-1 and 41-2 changes owing to a change in temperature.

Figure 7:
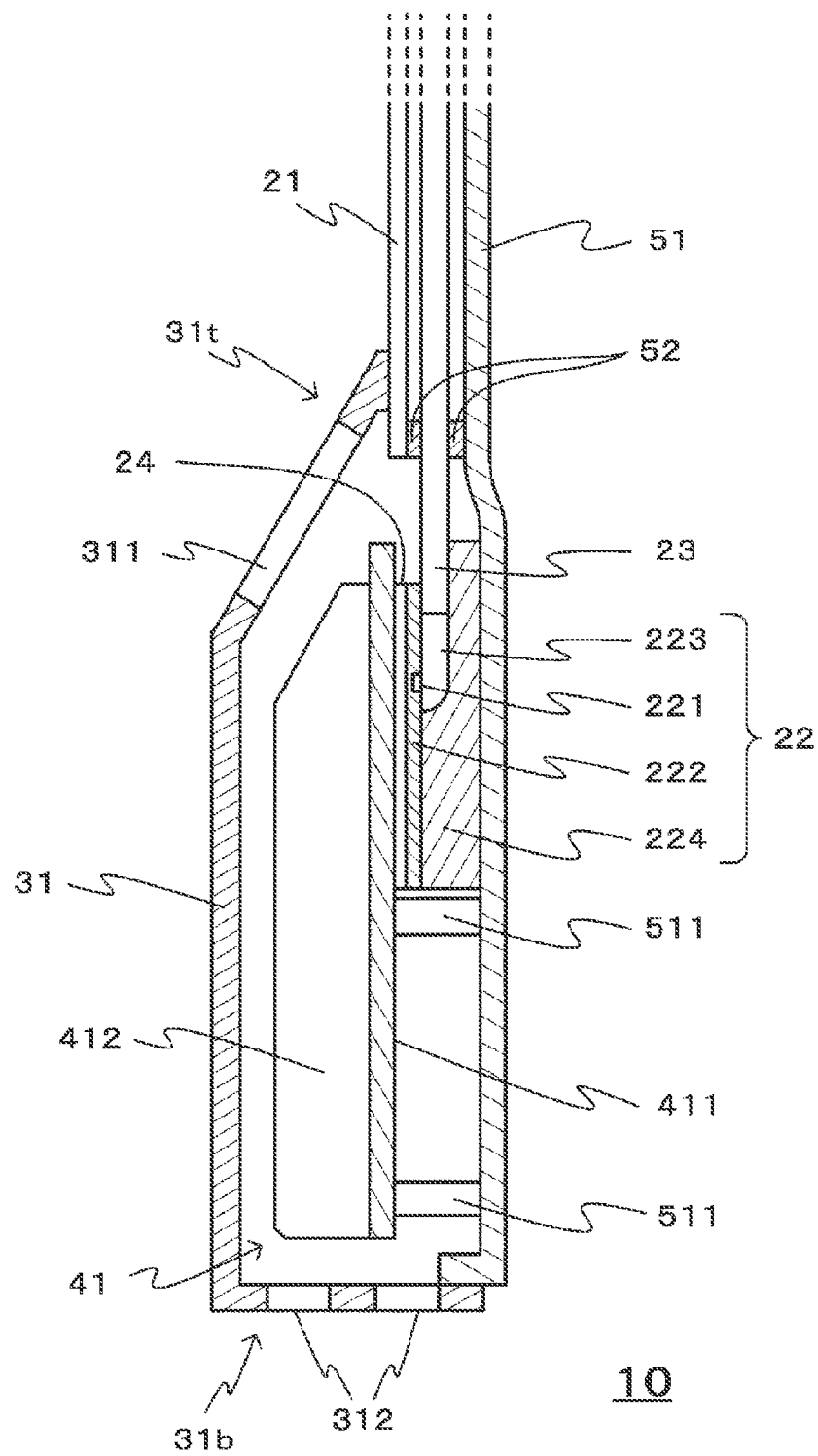
FIG. 7 is a cross-sectional view illustrating an example of part of an internal configuration of a display device including an emissive display panel.

FIG. 7 is a cross-sectional view illustrating an example of part of an internal configuration of a display device including a non-emissive display panel. As described above, the heat sink 41 is provided on the lower edge side of the display panel 21 with the heat radiation surface of the heat sink 41 being on the display surface side of the display panel 21. In addition, the cover 31 is provided to cover the heat sink 41, and the radiating fins 412 formed on the heat radiation surface of the heat sink 41 are located between the air holes 312 formed on the bottom face 31*b* of the cover 31 and the air holes 311 formed on the top face 31*t* thereof.

A non-emissive display panel such as a liquid crystal display panel is used for the display panel 21. A light source 22 to output light to illuminate the display panel 21 is formed on the lower edge side of the display panel 21 and in the direction along the lower edge. The light source 22 includes light emitting elements 221, a drive board 222, a light guide part 223, and a resin mold 224. Light emitting elements such as light emitting diodes (LEDs) are used for the light emitting elements 221. A plurality of light emitting elements 221 are mounted on the drive board 222 of the display panel 21 at predetermined intervals in a direction along an edge, and driven by a drive circuit provided on the drive board 222 or the like to emit light to illuminate the display panel 21. The light guide part 223 makes light, which is emitted from the light emitting elements 221, incident on a light guide plate 23 provided on a back surface side of the display panel 21. The resin mold 224 integrally fixes the light guide part 223 and the light guide plate 23 in such a manner as to cover the light guide part 223 and the light guide plate 23 so that light emitted from the light emitting elements 221 is made to be incident on a side face of the light guide plate 23 efficiently by the light guide part 223 without leaking outside.

The light guide plate 23 is provided on the back surface side, which is opposite to the display surface side, of the display panel 21 with a spacer 52 between the display panel 21 and the light guide plate 23. The side face of the light guide plate 23 is connected with a light output surface of the light guide part 223, and the light guide plate 23 diffuses light incident on the side face and emits uniform light toward the display surface of the display panel 21.

In addition, the drive board 222 of the light source 22 is mounted on the mounting face of the heat sink 41 with a buffer member 24 between the drive board 222 and the heat sink 41. The buffer member 24 is a member that absorbs a difference in thermal expansion between the drive board 222 and the heat sink 41 and has a predetermined thermal conductivity. A thermally-conductive grease, for example, is used for the buffer member 24.

A back chassis 51 is provided on the back face side of the resin mold 224 and the light guide plate 23. The back chassis 51 is mounted on the back face side of the light guide plate 23 with the spacer 52 therebetween. In addition, the back chassis 51 is mounted in close contact with the light source 22. Furthermore, a mounting boss 511 for fixing the heat sink 41 is provided on an inner face side of the back chassis 51. The heat sink 41 is fixed to the back chassis 51 by a screw or the like with the mounting hole 414 illustrated in FIGS. 4A, 4B, 4C, and 4D positioned at the position of the mounting boss 511. In addition, a plurality of heat sinks are connected via the coupling portions as described above in such a manner that curving of the display device in the front-back direction is prevented and adverse effects of a change in size in the longitudinal direction due to a change in temperature are prevented.

Figure 8:
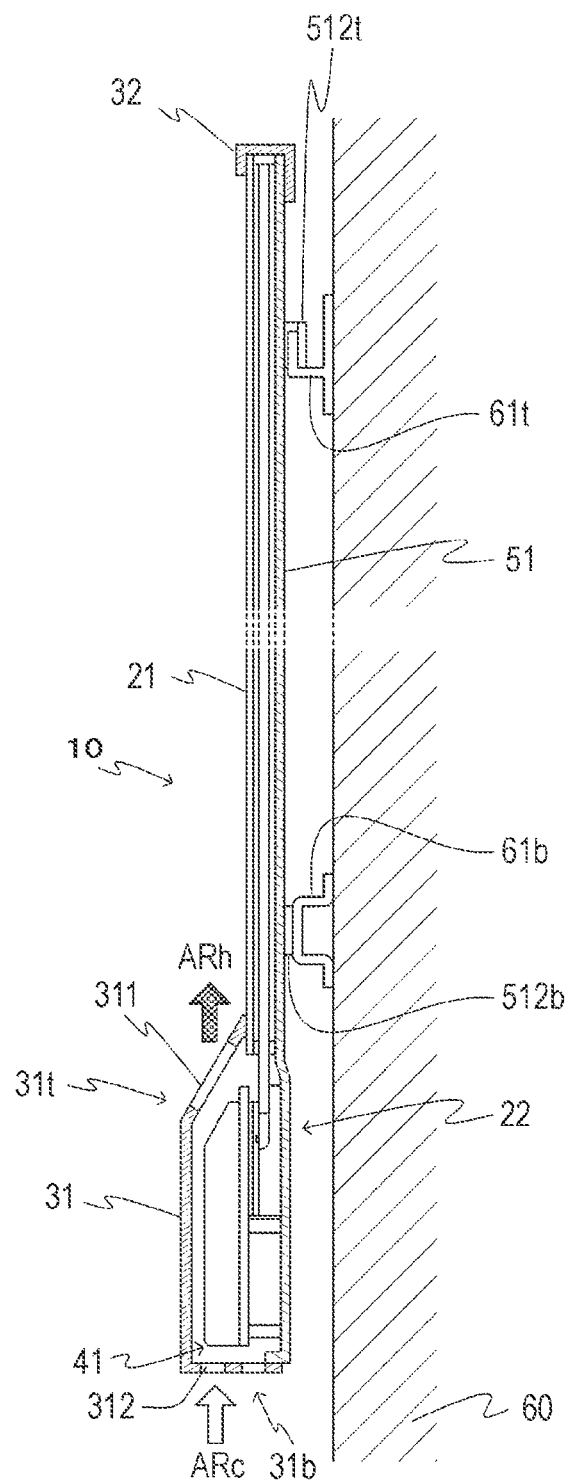
FIG. 8 is a drawing for explaining heat radiating operation of the display device.

FIG. 8 is a drawing for explaining heat radiating operation of the display device. An example of a state in which the display device 10 is mounted on a wall surface is illustrated. An upper support member 61t and a lower support member 61b are provided on the wall surface 60. In addition, an upper hook 512t and a lower hook 512b are provided on the back chassis 51 of the display device 10. Note that a cover 32 that covers the display panel 21, the light guide plate 23, the back chassis 51, and the like is provided on a top end of the display device 10. The upper hook 512t and the lower hook 512b of the back chassis 51 are hooked on the upper support member 61t and the lower support member 61b, respectively, on the wall surface 60, so that the display device 10 is mounted on the wall surface 60.

In the display device 10 mounted in this manner, the heat sinks 41 are cooled by air taken in through the air holes 312 formed on the bottom face 31b of the cover 31 as indicated by an arrow ARc. In addition, the air heated by the heat from the heat sinks 41 is released through the air holes 311 formed on the top face 31t of the cover 31 as indicated by an arrow ARh.

The heat generated by the heat source can thus be dissipated outside the display device 10 without generation of noise due to a fan and without occurrence of clogging or the like of front holes and back holes due to dust and dirt sucked during forced air cooling.

In addition, the air taken in through the air holes 312 formed on the bottom face 31b of the cover 31 draws heat from the heat sinks 41 and is dissipated through the air holes 311 formed on the top face 31t of the cover 31, which makes air convection straight. Thus, efficient heat dissipation with a small ventilation resistance is achieved. Furthermore, since the heat dissipation takes place on the display surface side of the display panel 21, discoloration of wall paper or the like due to long-term use is prevented or reduced as compared to a display device in which heat dissipation takes place on a back face side.

2. Second Embodiment

While the case where the heat sink part 40 is provided on the lower edge side of the display panel 21 is described in the first embodiment described above, a case in which a heat sink part 40 is provided on an upper edge side of a display panel 21 will be described in a second embodiment.

Figure 9:
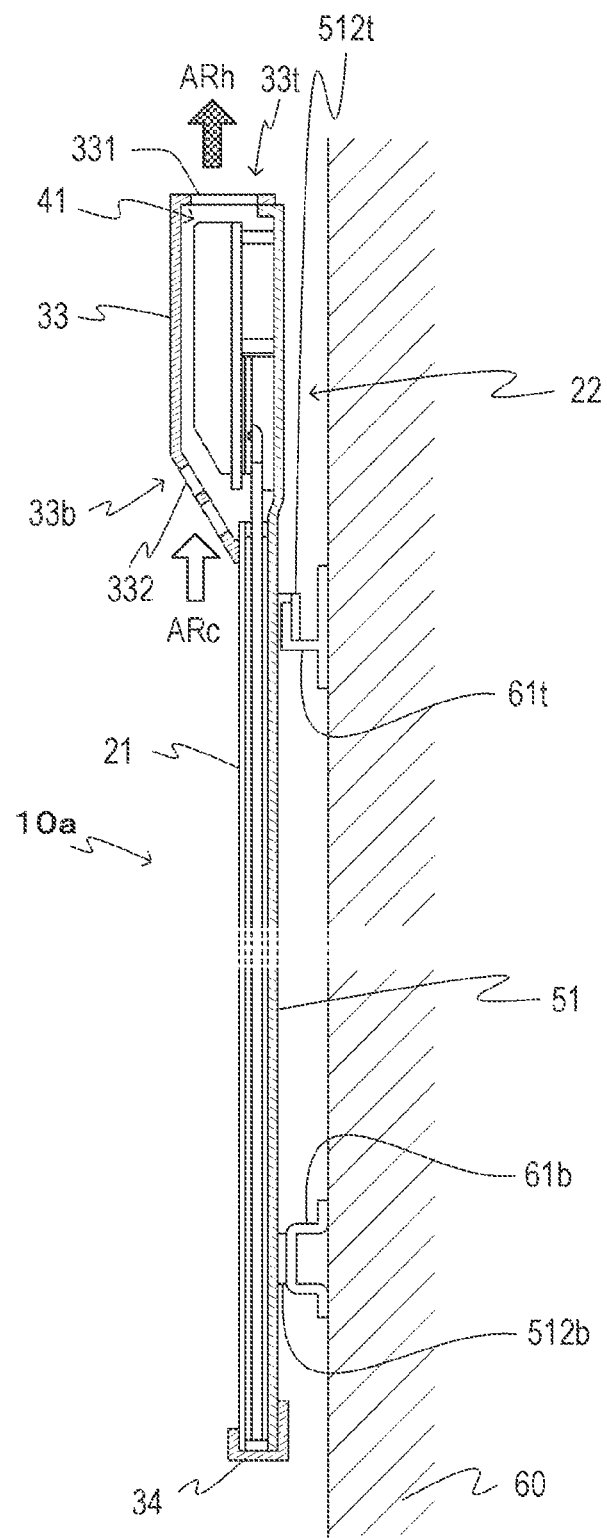
FIG. 9 illustrates an example of a configuration in a case where a heat sink part is provided on an upper edge side of a display panel.

FIG. 9 illustrates an example of a configuration in a case where a heat sink part is provided on an upper edge side of a display panel. In a display device 10a, a cover 33 is provided on the upper edge side of the display panel 21 and a cover 34 is provided on a lower edge side thereof. The cover 33 provided on the upper edge side of the display panel 21 has a shape similar to a vertically-reversed shape of the cover 31 in the first embodiment. Air holes having a size set so that foreign substances and the like are less likely to enter therethrough, such as air holes 331 having a shape similar to that of the air holes 311 formed on the top face of the cover 31, are formed on a top face of the cover 33.

Air holes 332 are formed on a bottom face 33b of the cover 33. The air holes 332 have larger openings than those of the air holes 331 formed on the top face 33t since foreign substances and the like are less likely to enter through the air holes 332, which are formed on the bottom face 33b, and so that the ventilation amount becomes larger. Note that the cover 33 has a smaller height on a front side than on a back side (on the side of the display panel), and the bottom face 33b is thus an inclined face.

A heat sink part 40, which is a vertical reverse of the heat sink part 40 in the first embodiment, is mounted on a back chassis 51. In addition, a light source 22, which is a vertical reverse of that in the first embodiment, is mounted on the mounting faces of the heat sinks 41 of the heat sink part 40.

In the display device 10a having such a configuration, the heat sinks 41 are cooled by air taken in through the air holes 332 formed on the bottom face 33b of the cover 33 as indicated by an arrow ARc. In addition, the air heated by the heat from the heat sinks 41 is released through the air holes 331 formed on the top face 33t of the cover 33 as indicated by an arrow ARh.

The heat generated by the heat source can thus be dissipated outside the display device without generation of noise due to a fan and without occurrence of clogging or the like of front holes and back holes due to dust and dirt sucked during forced air cooling, similarly to the first embodiment.

In addition, the air taken in through the air holes 332 formed on the bottom face 33b of the cover 33 draws heat from the heat sinks 41 and is dissipated through the air holes 331 formed on the top face 33t of the cover 33, which makes air convection straight. Thus, efficient heat dissipation with a small ventilation resistance is achieved. Furthermore, since the heat dissipation takes place on the upper edge side of the display panel 21, discoloration of wall paper or the like due to long-term use is prevented or reduced as compared to a display device in which heat dissipation takes place on a back face side. Furthermore, since the heat dissipation takes place on the upper edge side of the display panel 21, the display panel 21 is prevented from being heated owing to the heat dissipation.

3. Third Embodiment

Next, a third embodiment will be described. In the third embodiment, an example of a case where heat sink parts are provided on an upper edge side and a lower edge side of a display panel is presented.

Figure 10:
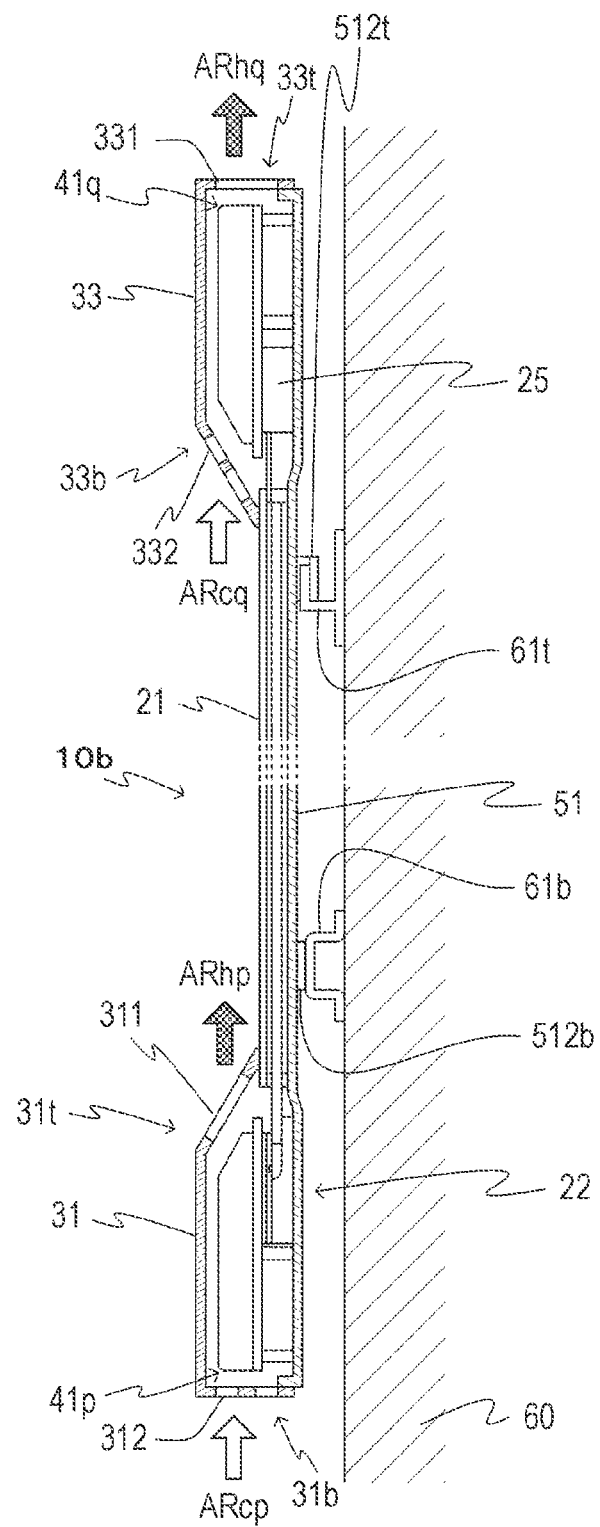
FIG. 10 illustrates an example of a configuration in a case where heat sink parts are provided on an upper edge side and a lower edge side of a display panel.

FIG. 10 illustrates an example of a configuration in the case where heat sink parts are provided on an upper edge side and a lower edge side of a display panel. In a display device 10b, a cover 31 is provided on a lower edge side of a display panel 21, and a cover 33 is provided on an upper edge side thereof.

Air holes 311 through which foreign substances and the like are less likely to enter are formed on a top face of the cover 31 provided on the lower edge side of the display panel 21. In addition, the cover 31 has a smaller height on a front side than on a back side (on the side of the display panel), and the top face 31t is thus an inclined face. Air holes 312 are formed on a bottom face 31b of the cover 31. The air holes 312 have larger openings than those of the air holes 311 formed on the top face 31t since foreign substances and the like are less likely to enter through the air holes 312, which are formed on the bottom face 31b, and so that the ventilation amount becomes larger.

Air holes through which foreign substances and the like are less likely to enter, such as air holes 331 having a shape similar to that of the air holes 311 formed on the top face of the cover 31, are formed on a top face of the cover 33 provided on the upper edge side of the display panel 21. Air holes 332 are formed on a bottom face 33b of the cover 33. The air holes 332 have larger openings than those of the air holes 331 formed on the top face 33t since foreign substances and the like are less likely to enter through the air holes 332, which are formed on the bottom face 33b, and so that the ventilation amount becomes larger. Note that the cover 33 has a smaller height on a front side than on a back side (on the side of the display panel), and the bottom face 33b is thus an inclined face.

Heat sinks 41p and 41q are mounted on a back chassis 51, the heat sink 41p being covered by the cover 31, the heat sink 41q being covered by the cover 33.

The heat sinks 41p and 41q have a configuration similar to that of the heat sinks 41 in the first embodiment, and the heat sink 41p is oriented similarly to the heat sinks 41 but the heat sink 41q is vertically reversed with respect to the heat sink 41p, for example. A light source 22 to output light to illuminate the display panel 21, for example, is mounted on a mounting face of the heat sink 41p. In addition, another heat source, such as a drive unit 25 including a drive circuit for driving the display panel 21, a power supply circuit, and the like, is mounted on a mounting face of the heat sink 41q.

In the display device 10b having such a configuration, the heat sink 41p is cooled by air taken in through the air holes 312 formed on the bottom face 31b of the cover 31 as indicated by an arrow ARcp. In addition, the air heated by the heat from the heat sink 41p is released through the air holes 311 formed on the top face 31t of the cover 31 as indicated by an arrow ARhp. In addition, the heat sink 41q is cooled by air taken in through the air holes 332 formed on the bottom face 33b of the cover 33 as indicated by an arrow ARcq. Furthermore, the air heated by the heat from the heat sink 41q is released through the air holes 331 formed on the top face 33t of the cover 33 as indicated by an arrow ARhq.

The heat generated by the heat source can thus be dissipated outside the display device 10 without generation of noise due to a fan and without occurrence of clogging or the like of front holes and back holes due to dust and dirt sucked during forced air cooling, similarly to the first and second embodiments.

In addition, the air taken in through the air holes 312 formed on the bottom face 31b of the cover 31 draws heat from the heat sink 41p and is dissipated through the air holes 311 formed on the top face 31t of the cover 31, which makes air convection straight. Similarly, the air taken in through the air holes 332 formed on the bottom face 33b of the cover 33 draws heat from the heat sink 41q and is dissipated through the air holes 331 formed on the top face 33t of the cover 33, which makes air convection straight. Thus, efficient heat dissipation with a small ventilation resistance is achieved. In addition, since the heat dissipation takes place on the display surface side and on the upper edge side of the display panel 21, discoloration of wall paper or the like due to long-term use is prevented or reduced as compared to a display device in which heat dissipation takes place on a back face side. Furthermore, since the heat dissipation takes place on the display surface side and on the upper edge side of the display panel 21, application to a case of a large heat quantity is also achieved.

4. Other Embodiments

Note that the examples of cases in which a non-emissive display panel, which uses light from a light source for display, is used are presented in the embodiments described above. The display panel, however, is not limited to a non-emissive display panel but may be an emissive display panel such as a display panel using organic light emitting diodes (OLEDs).

Figure 11:
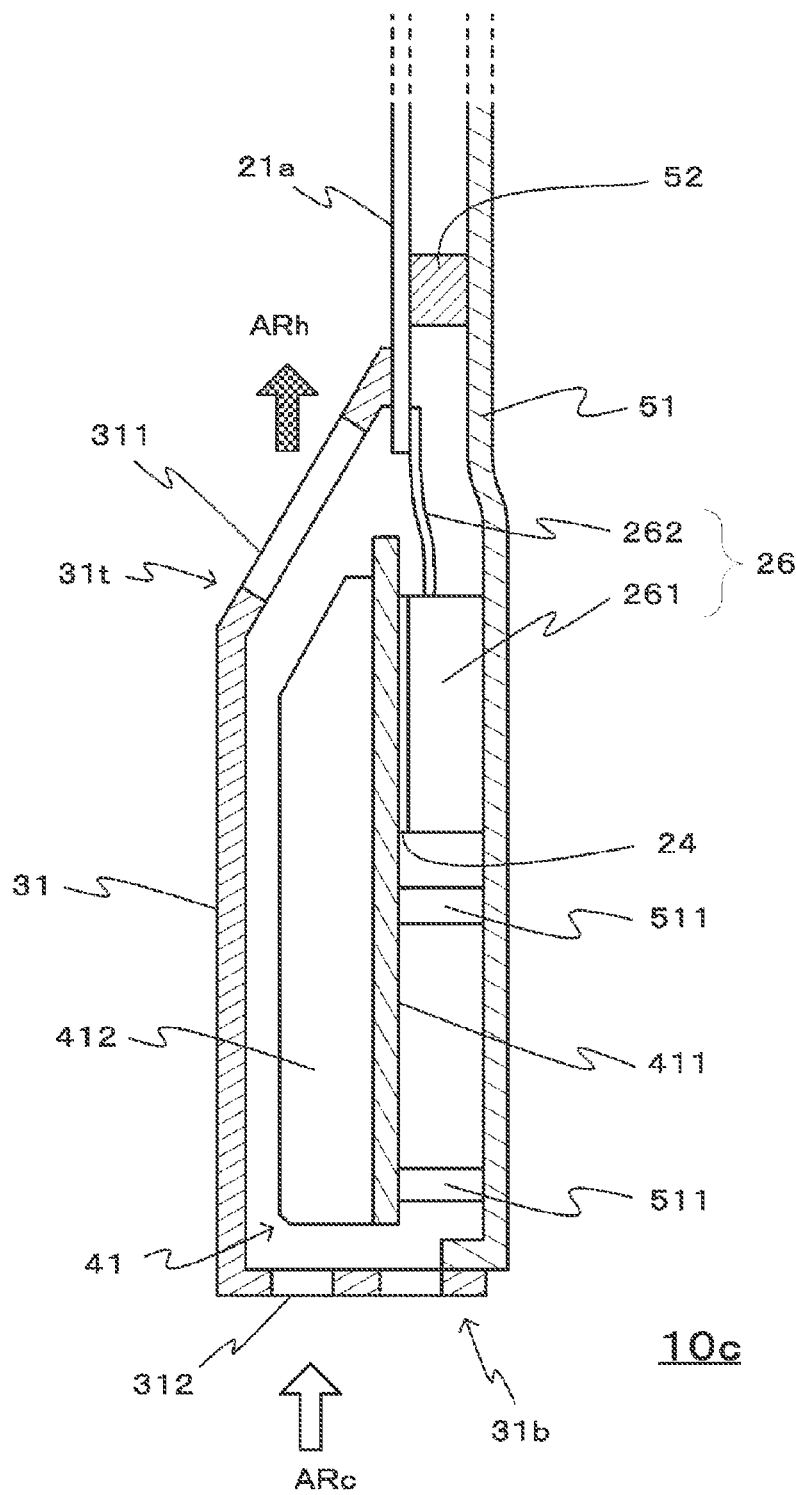
FIG. 11 is a cross-sectional view illustrating an example of part of an internal configuration of a display device including an emissive display panel.

FIG. 11 is a cross-sectional view illustrating an example of part of an internal configuration of a display device including an emissive display panel. In a display device 10c, a heat sink 41 is provided on a lower edge side of an emissive display panel 21a with a heat radiation surface of the heat sink 41 being on a display surface side of the display panel 21. In addition, the cover 31 is provided to cover the heat sink 41, and the radiating fins 412 formed on the heat radiation surface of the heat sink 41 are located between the air holes 312 formed on the bottom face 31b of the cover 31 and the air holes 311 formed on the top face 31t thereof.

A drive unit 26 that drives the display panel 21a includes a drive circuit unit 261 and a connection cable 262, an end of which is connected to the display panel 21a and through which a drive signal is supplied from the drive circuit unit 261 to the display panel 21a.

In addition, the drive circuit unit 261 is mounted on a mounting face of the heat sink 41 with a buffer member 24 between the drive circuit unit 261 and the heat sink 41. The buffer member 24 is a member having a predetermined thermal conductivity and being capable of absorbing a difference in thermal expansion between the drive circuit unit 261 and the heat sink 41. A thermally-conductive grease, for example, is used for the buffer member 24.

A back chassis 51 is provided on a back face side of the display panel 21a and the drive circuit unit 261. The back chassis 51 is mounted on the back face side of the display panel 21a with a spacer 52 between the back chassis 51 and the display panel 21a. In addition, the back chassis 51 is mounted in close contact with the drive circuit unit 261. Furthermore, a mounting boss 511 for fixing the heat sink 41 is provided on an inner face side of the back chassis 51. The heat sink 41 is fixed to the back chassis 51 by a screw or the like with the mounting hole 414 illustrated in FIGS. 4A 4B, 4C, and 4D positioned at the position of the mounting boss 511. In addition, a plurality of heat sinks 41 are connected via the coupling portions as described above in such a manner that curving of the display device in the front-back direction is prevented and adverse effects of a change in size in the longitudinal direction due to a change in temperature are prevented.

In the display device 10c including the emissive display panel, the heat sinks 41 are cooled by air taken in through the air holes 312 formed on the bottom face 31b of the cover 31 as indicated by an arrow ARc. In addition, the air heated by the heat from the heat sinks 41 is released through the air holes 311 formed on the top face 31t of the cover 31 as indicated by an arrow ARh.

The heat generated by the drive circuit unit can thus be dissipated outside the display device without generation of noise due to a fan and without occurrence of clogging or the like of front holes and back holes due to dust and dirt sucked during forced air cooling.

In addition, the air taken in through the air holes 312 formed on the bottom face 31b of the cover 31 draws heat from the heat sinks 41 and is dissipated through the air holes 311 formed on the top face 31t of the cover 31, which makes air convection straight. Thus, efficient heat dissipation with a small ventilation resistance is achieved. In addition, since the heat dissipation takes place on the display surface side of the display panel 21a, discoloration of wall paper or the like due to long-term use is prevented or reduced as compared to a display device in which heat dissipation takes place on a back face side.

Figure 12:
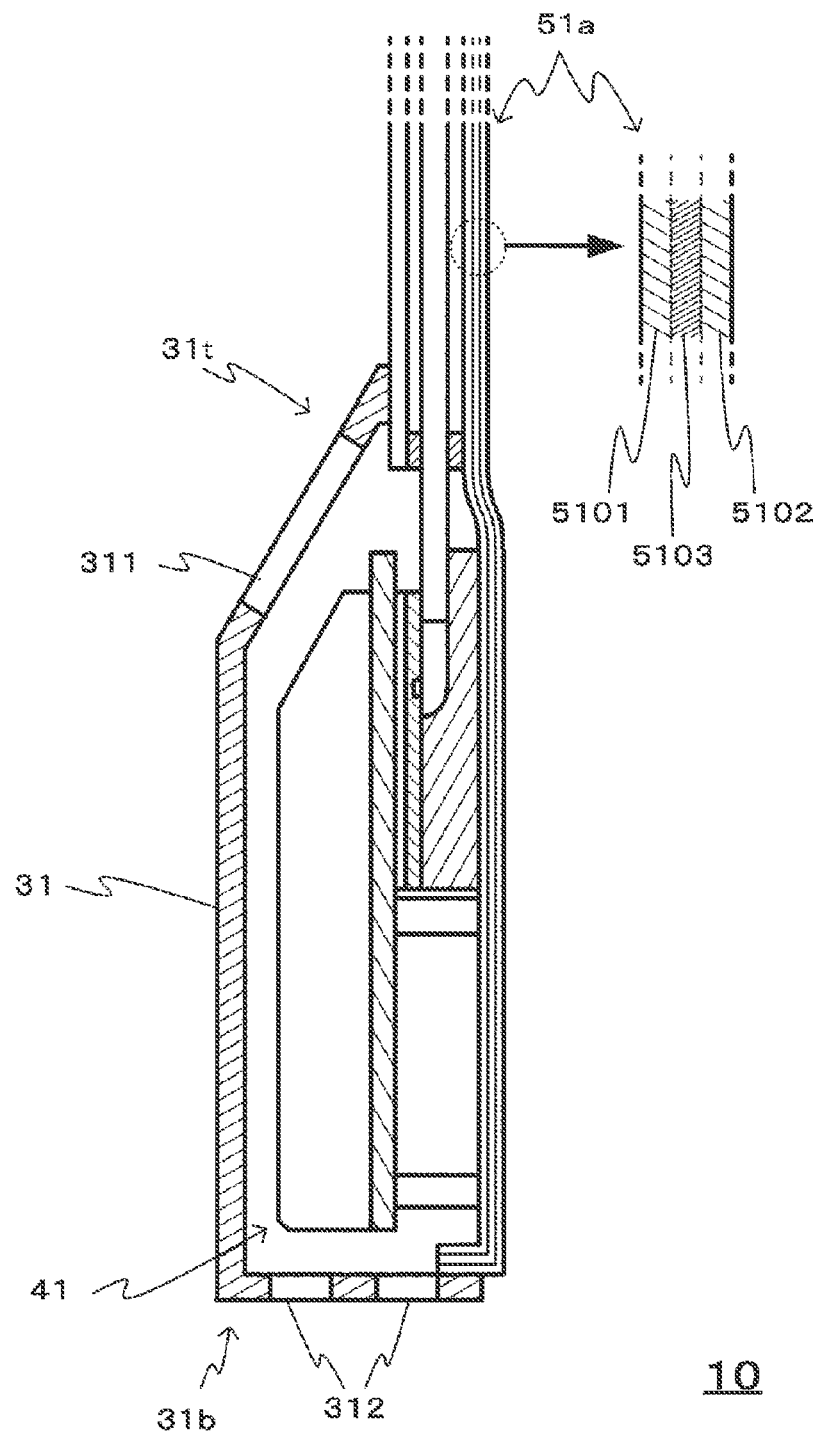
FIG. 12 is a cross-sectional view illustrating an example of part of an internal configuration of a display device including a back chassis having a heat insulation structure.

In addition, in the embodiments described above, the back chassis may have a heat insulation structure so that discoloration of wall paper due to long-term use and the like is prevented or reduced. FIG. 12 is a cross-sectional view illustrating an example of part of an internal configuration of a display device including a back chassis having a heat insulation structure. A back chassis 51a is constituted by a laminated base material including metal sheets 5101 and 5102, such as aluminum sheets, steel sheets, or stainless steel sheets, and a heat insulating layer 5103 such as urethane resin provided between the metal sheets 5101 and 5102. With such a back chassis 51a, heat generated inside the display device is less likely to be transferred to the outside than with a back chassis without the heat insulating layer 5103. Thus, use of a back chassis having a heat insulation structure suppresses increase in the temperature of the wall surface on which the display device is mounted. Thus, discoloration of wall paper or the like due to heat dissipated to the back face of the display device is effectively prevented or reduced.

Note that the heat sinks 41 only need to be provided in such a manner that the radiating fins 412 are positioned between the air holes on the bottom face and the air holes on the top face of the cover, and are not limited to the case where the radiating fins 412 are positioned in front of the display panel 21 as in the embodiments described above.

Figure 13:
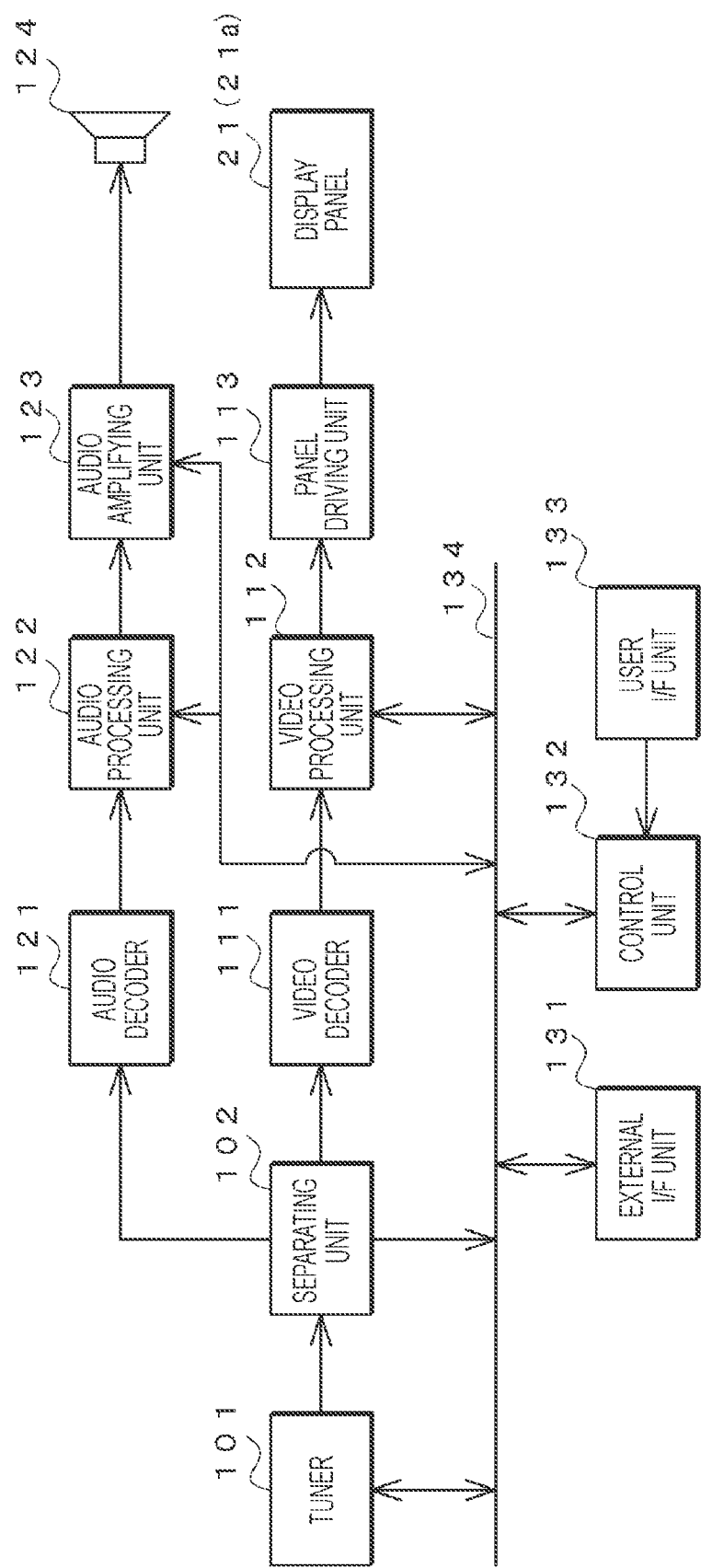
FIG. 13 is a diagram illustrating an example of an internal configuration of a display device in a case where the display device is a television device.

FIG. 13 is a block diagram illustrating an example of an internal configuration of a display device in a case where the display device is a television device. The display device includes a tuner 101, a separating unit 102, a video decoder 111, a video processing unit 112, a panel driving unit 113, and a display panel 21, for example. The display device also includes an audio decoder 121, an audio processing unit 122, an audio amplifying unit 123, and a speaker 124. The display device further includes an external interface unit 131, a control unit 132, a user interface unit 133, a bus 134, and the like.

The tuner 101 extracts a signal of a desired channel from broadcast signals received by an antenna (not illustrated), and demodulates the extracted signal. The tuner 101 also outputs an encoded bit stream obtained by the demodulation to the separating unit 102.

The separating unit 102 separates a video stream and an audio stream of a program to be viewed from the encoded bit stream, and outputs the separated video stream to the video decoder 111 and the separated audio stream to the audio decoder 121. The separating unit 102 also extracts auxiliary data such as an electronic program guide (EPG) from the encoded bit stream, and supplies the extracted data to the control unit 132. Note that the separating unit 102 may descramble the encoded bit stream if the encoded bit stream is scrambled.

The video decoder 111 outputs video data, which are obtained by performing a decoding process on the video stream input from the separating unit 102, to the video processing unit 112.

The video processing unit 112 performs adjustment of brightness and colors, and the like on the video data input from the video decoder 111, and outputs the processed video data to the panel driving unit 113. The video processing unit 112 may also perform additional processes on the video data such as denoising depending on the settings. The video processing unit 112 may further generate an image of a graphical user interface (GUI) such as a menu, a button, or a cursor and superimpose the generated image on the video data.

The panel driving unit 113 includes the light emitting elements 221 of the light source unit 22 and the drive circuit unit 261 described above. The panel driving unit 113 generates a panel drive signal on the basis of the video data input from the video processing unit 112, and outputs the panel drive signal to the display panel 21 (21a). In addition, in a case where the non-emissive display panel 21 is used for the display panel, the panel driving unit 113 drives the light emitting elements 221 to output light to illuminate the display panel 21 as described above.

The display panel 21 drives a display device by the panel drive signal supplied from the panel driving unit 113 to display the video.

The audio decoder 121 performs a decoding process on the audio stream input from the separating unit 102, and outputs audio data obtained through the decoding process to the audio processing unit 122.

The audio processing unit 122 performs D/A conversion, equalizing, adjustment of acoustic effects, denoising, and the like on the audio data input from the audio decoder 121, and outputs an audio signal resulting from the processing to the audio amplifying unit 123.

The audio amplifying unit 123 amplifies the audio signal input from the audio processing unit 122 to a signal level according to a user setting and supplies the amplified audio signal to the speaker 124, so that audio is output from the speaker 124 at a desired volume.

The external interface unit 131 is an interface for connecting the display device with an external device or a network. For example, the video stream or the audio stream received via the external interface unit 131 may be decoded by the video decoder 111 or the audio decoder 121.

The control unit 132 includes a processor such as a central processing unit (CPU), and a memory such as a random access memory (RAM) and a read only memory (ROM).

The memory stores programs to be executed by the CPU, program data, EPG data, data acquired via the network, and the like. Programs stored in the memory are read and executed by the CPU when the display device is activated, for example. The CPU controls the operation of the display device according to control signals input from the user interface unit 133, for example, by executing the programs.

The user interface unit 133 is connected with the control unit 132. The user interface unit 133 includes buttons and switches for users to operate the display device, a receiving unit for receiving remote control signals, and the like, for example. The user interface 133 detects operation performed by a user via these components, generates a control signal, and outputs the generated control signal to the control unit 132.

The bus 134 connects the tuner 101, the separating unit 102, the video processing unit 112, the audio processing unit 122, the audio amplifying unit 123, the external interface unit 131, and the control unit 132 with one another.

Note that the effects mentioned herein are exemplary only and are not limiting, and additional effects that are not described may also be produced. In addition, the present technology is not to be interpreted as being limited to the embodiments of the technology described above. The embodiments of the present technology disclose the present technology in the form of examples; and a person skilled in the art can obviously make modification or substitution of the embodiments without departing from the scope of the present technology. Thus, the claims should be referred to for determining the scope of the present technology.

A display device of the present technology can also have the following configurations.

(1) A display device including:
a heat sink part provided on a lower edge side or an upper edge side of a display panel, a heat radiation surface of the heat sink part being on a display surface side of the display panel, a heat source that generates heat owing to operation using the display panel being mounted on a surface of the heat sink part different from the heat radiation surface; and
a cover provided on the display surface side of the display panel to cover the heat sink part, the cover having a top face and a bottom face each having air holes.

(2) The display device described in (1), in which the heat sink part includes a plurality of heat sinks connected in a direction along a lower edge or an upper edge of the display panel, a coupling portion formed on each of the heat sinks being coupled to a coupling portion formed on another of the heat sinks.

(3) The display device described in (2), in which the coupling portions connect the plurality of heat sinks such that the plurality of heat sinks can be elongated and contracted in the direction along the lower edge or the upper edge of the display panel.

(4) The display device described in (2) or (3), in which the coupling portions prevents curving in a direction perpendicular to the heat radiation surface at the coupling portions of the plurality of heat sinks.

(5) The display device described in (4),
in which the coupling portions each have a first engagement piece protruding on a heat radiation surface side of a coupling face of the heat sink and a second engagement piece protruding on a side opposite to the heat radiation surface side,
the first engagement piece and the second engagement piece are arranged at predetermined intervals, positions of inner faces of the first engagement piece and the second engagement piece being in alignment with one another, and a first heat sink and a second heat sink are connected such that inner faces of a first engagement piece of the first heat sink and a second engagement piece of the second heat sink face each other and that inner faces of a second engagement piece of the first heat sink and a first engagement piece of the second heat sink face each other, so that curving in a direction perpendicular to the display surface at the coupling portions is prevented.

(6) The display device described in any one of (2) to (5), in which radiating fins are formed on the heat radiation surface of the heat sink, and
the radiating fins of the heat sink are located between the air holes on the bottom face and the air holes on the top face of the cover.

(7) The display device described in any one of (1) to (6), in which the display panel is a non-emissive display panel, and
the heat source is a light source that outputs light to illuminate the display panel.

(8) The display device described in (7),
in which the light source is fixed to the heat sink with a buffer member having a predetermined thermal conductivity and absorbing a difference in thermal expansion between the light source and the heat sink.

(9) The display device described in (8),
in which the buffer member is thermally-conductive grease.

(10) The display device described in any one of (7) to (9), in which the light source includes light emitting elements that emit light to illuminate the display panel, a board on which the light emitting elements are mounted, a light guide part to guide light emitted from the light emitting elements to a light guide plate provided on a back surface of the display panel, and a resin mold that integrally fixes the light guide part onto the board, and
the light source is provided between an inner face side of a back chassis and the heat sink, the back chassis being provided on a side opposite to the display surface side of the display panel, the board facing the heat sink, the resin mold facing the back chassis.

(11) The display device described in any one of (1) to (10),
in which a back chassis is provided on a side opposite to the display surface side of the display panel, and the heat sink is fixed to the back chassis.

(12) The display device described in (11),
in which the back chassis has a structure including metal sheets, and a heat insulating layer between the metal sheets.

(13) The display device described in any one of (1) to (12),
in which the heat source and the heat sink part are provided on each of a lower edge side and an upper edge side of the display panel, and the heat source is mounted on the heat sink part at each of the lower edge side and the upper edge side.

(14) The display device described in any one of (1) to (6) and (11) to (13),
in which the display panel is an emissive display panel, and
the heat source includes a drive circuit that drives the display panel.

INDUSTRIAL APPLICABILITY

In the display device of the present technology, a heat sink part is provided on a lower edge side or an upper edge side of a display panel, a heat radiation surface of the heat sink part being on a display surface side of the display panel, a heat source that generates heat owing to operation using the display panel being mounted on a surface of the heat sink part different from the heat radiation surface. In addition, a cover is provided on the display surface side of the display panel to cover the heat sink part, the cover having a top face and a bottom face each having air holes. Thus, since air taken in through the air holes formed on the bottom face of the cover cools the heat sinks and air heated by the heat of the heat sinks is dissipated through the air holes formed on the top face of the cover, heat generated inside the display device is efficiently dissipated from the display surface side with a small ventilation resistance. The display device is therefore suitable for a display device including a display panel such as a liquid crystal display or an OLED display.

REFERENCE SIGNS LIST 10, 10a, 10b, 10c Display device
20 Display panel part
21, 21a Display panel
22 Light source
23 Light guide plate
24 Buffer member
25, 26 Drive unit
31, 32, 33, 34 Cover
31b, 33b Bottom face
31t, 33t Top face
40 Heat sink part
41, 41p, 41q, 41-1, 41-2 Heat sink
51, 51a Back chassis
52 Spacer
60 Wall surface
61b Lower support member
61t Upper support member
101 Tuner
102 Separating unit
111 Video decoder
112 Video processing unit
113 Panel driving unit
121 Audio decoder
122 Audio processing unit
123 Audio amplifying unit
124 Speaker
131 External interface unit
132 Control unit
133 User interface unit
134 Bus
221 Light emitting element
222 Drive board
223 Light guide part
224 Resin mold
261 Drive circuit unit
262 Connection cable
311, 312, 331, 332 Air hole
411 Body part
412 Radiating fin
413L, 413R Coupling portion
413Lb, 413Lc, 413Lt, 413Rb, 413Rc, 413Rt Engagement piece
414 Mounting hole
511 Mounting boss
512b Lower hook
512t Upper hook
5101, 5102 Metal sheet
5103 Heat insulating layer

The invention claimed is:

1. A display device comprising:
a heat sink part provided on a side of a lower edge or a side of an upper edge of a display panel, a heat radiation surface of the heat sink part being on a display surface side of the display panel, a heat source that generates heat owing to operation using the display panel being mounted on a surface of the heat sink part different from the heat radiation surface; and
a cover provided on the display surface side of the display panel to cover the heat sink part, the cover having a top face and a bottom face each having air holes, and
wherein,
the display panel is a non-emissive display panel, and
the heat source is a light source that outputs light to illuminate the display panel.

2. The display device according to claim 1,
wherein the heat sink part includes a plurality of heat sinks connected in a direction along the lower edge or the upper edge of the display panel, a coupling portion formed on each of the heat sinks being coupled to a coupling portion formed on another of the heat sinks.

3. The display device according to claim 2,
wherein the coupling portions connect the plurality of heat sinks such that the plurality of heat sinks can be elongated and contracted in the direction along the lower edge or the upper edge of the display panel.

4. The display device according to claim 2,
wherein the coupling portions prevents curving of at least one of the plurality of heat sinks in a first direction perpendicular to the heat radiation surface at the coupling portions of the plurality of heat sinks.

5. The display device according to claim 4,
wherein the coupling portions each have a first engagement piece protruding on a heat radiation surface side of a coupling face of the heat sink and a second engagement piece protruding on a side opposite to the heat radiation surface side,
the first engagement piece and the second engagement piece are arranged at predetermined intervals, positions of inner faces of the first engagement piece and the second engagement piece being in alignment with one another, and
a first heat sink and a second heat sink are connected such that inner faces of a first engagement piece of the first heat sink and a second engagement piece of the second heat sink face each other and that inner faces of a second engagement piece of the first heat sink and a first engagement piece of the second heat sink face each other, so that curving in a second direction perpendicular to the display surface at the coupling portions is prevented.

6. The display device according to claim 2,
wherein radiating fins are formed on the heat radiation surface of the heat sink, and
the radiating fins of the heat sink are located between the air holes on the bottom face and the air holes on the top face of the cover.

7. The display device according to claim 1,
wherein the light source is fixed to the heat sink with a buffer member having a predetermined thermal conductivity and absorbing a difference in thermal expansion between the light source and the heat sink.

8. The display device according to claim 7,
wherein the buffer member is thermally-conductive grease.

9. The display device according to claim 1, wherein the light source includes light emitting elements that emit light to illuminate the display panel, a board on which the light emitting elements are mounted, a light guide part to guide light emitted from the light emitting elements to a light guide plate provided on a back surface of the display panel, and a resin mold that integrally fixes the light guide part onto the board, and the light source is provided between an inner face side of a back chassis and the heat sink, the back chassis being provided on a side opposite to the display surface side of the display panel, the board facing the heat sink, the resin mold facing the back chassis.

10. The display device according to claim 1, wherein a back chassis is provided on a side opposite to the display surface side of the display panel, and the heat sink is fixed to the back chassis.

11. The display device according to claim 10, wherein the back chassis has a structure including metal sheets, and a heat insulating layer between the metal sheets.

12. The display device according to claim 1, wherein the heat source and the heat sink part are provided on each side of each lower edge and the side of the upper edge of the display panel, and the heat source is mounted on the heat sink part at each of the lower edge side and the upper edge side.

13. A display device, comprising:

a heat sink part provided on a side of a lower edge or a side of an upper edge of a display panel, a heat radiation surface of the heat sink part being on a display surface side of the display panel, a heat source that generates heat owing to operation using the display panel being mounted on a surface of the heat sink part different from the heat radiation surface; and a cover provided on the display surface side of the display panel to cover the heat sink part, the cover having a top face and a bottom face each having air holes, and wherein, the heat source is a light source that outputs light to illuminate the display panel, the display panel is an emissive display panel, and the heat source includes a drive circuit that drives the display panel.

* * * * *